United States Patent [19]

Mochida et al.

[11] Patent Number: 5,485,063
[45] Date of Patent: Jan. 16, 1996

[54] MOTOR CONTROL CIRCUIT FOR A WIRE BONDING APPARATUS

[75] Inventors: Tooru Mochida; Yoshimitsu Terakado; Hijiri Hayashi, all of Tokyo, Japan

[73] Assignee: Kabushiki Kaisha Shinkawa, Tokyo, Japan

[21] Appl. No.: 99,623

[22] Filed: Jul. 30, 1993

[30] Foreign Application Priority Data

Aug. 4, 1992 [JP] Japan ................................ 4-227974

[51] Int. Cl.⁶ .................................................. H01L 21/60
[52] U.S. Cl. .......................... 318/34; 318/254; 219/69.16; 219/69.15; 228/102
[58] Field of Search ...................... 318/43–89, 560–646; 219/69.16, 69.15, 69.10; 228/180.21, 102, 179.1, 105, 160, 111, 6.2, 4.5, 110, 1.1; 364/162, 166, 474.01–474.32; 356/372, 375, 444, 384, 394

[56] References Cited

U.S. PATENT DOCUMENTS

| | | | |
|---|---|---|---|
| 4,150,275 | 4/1979 | Wavre | 219/69 V |
| 4,817,848 | 4/1989 | Gabaldon | 228/102 |
| 5,158,223 | 10/1992 | Shimizu | 228/1.1 |
| 5,238,174 | 8/1993 | Ricketson et al. | 228/180.21 |
| 5,251,805 | 10/1993 | Tani et al. | 228/180.5 |
| 5,293,217 | 3/1994 | Sugawara | 356/372 |
| 5,307,978 | 5/1994 | Ricketson et al. | 228/4.5 |
| 5,310,982 | 5/1994 | Chang et al. | 219/69.16 |
| 5,316,204 | 5/1994 | Takehashi et al. | 228/179.1 |
| 5,317,242 | 5/1994 | Kashima et al. | 318/254 |

*Primary Examiner*—Paul Ip
*Attorney, Agent, or Firm*—Koda and Androlia

[57] ABSTRACT

A motor control circuit for a wire bonding apparatus for manufacturing semiconductor devices, etc. using a feedback gain circuit which performs feedback control of a synthesized signal that drives a Z-axis motor for moving a capillary up and down. The gain value of the feedback gain circuit is controlled by a computer, thus allowing smooth and stable control of the motor operation even after rotational speed change of the Z-axis motor, and assuring a stable wire bonding.

1 Claim, 5 Drawing Sheets

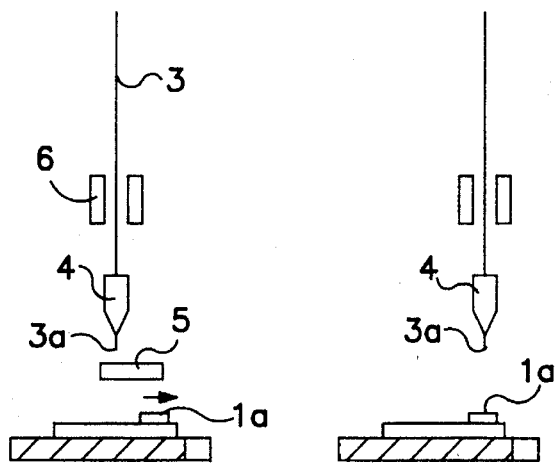
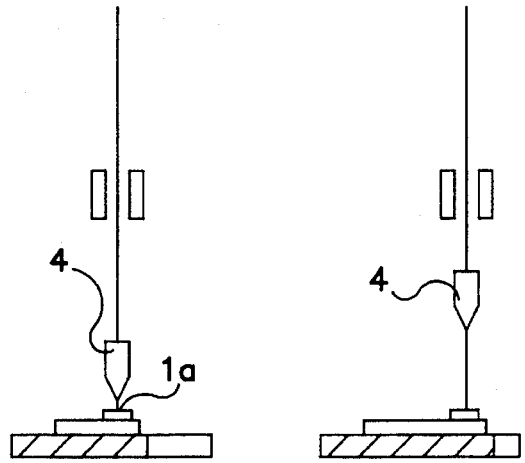
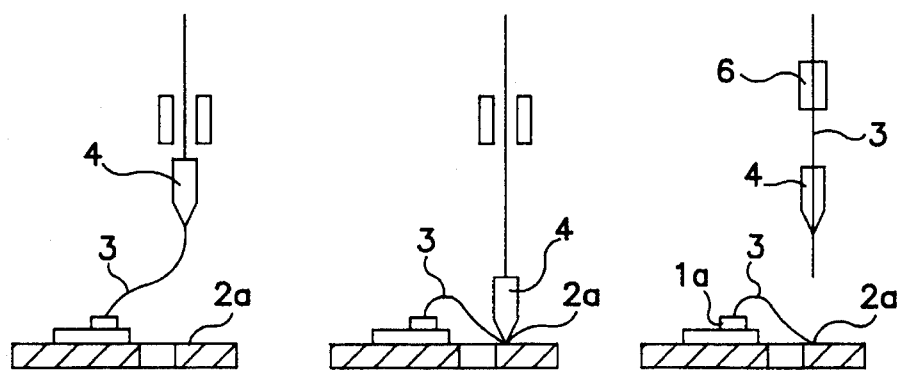
FIG. 4(a)  FIG. 4(b)  FIG. 4(c)  FIG. 4(d)  FIG. 4(e)  FIG. 4(f)  FIG. 4(g)

MOTOR CONTROL CIRCUIT FOR A WIRE BONDING APPARATUS

BACKGROUND OF THE INVENTION

1. Field of the Invention

The present invention relates to a motor control circuit for a wire bonding apparatus.

2. Prior Art

FIGS. 4(a) through 4(g) illustrate one method of wire bonding for semiconductor devices, etc., and FIG. 5 shows a wire bonding apparatus for such a method.

As shown in FIG. 5, a bonding head 11 is mounted on an XY table 10 which is driven by an X-axis motor and a Y-axis motor (both not shown). A supporting shaft 12 is mounted on the bonding head 11 in a rotatable fashion, and a horn holder 13 is fastened to this supporting shaft 12. A horn 14 is attached to the horn holder 13, and a capillary 4 (which is shown in FIGS. 4(a) to 4(g)) is provided at the tip end of the horn 14. The tip of a bonding wire 3 which is wound on a spool (not shown) is passed through the capillary 4.

A Z-axis motor 15 which is capable of making forward and reverse rotations is mounted on the bonding head 11, and a cam shaft 16 is coupled to the output shaft of the Z-axis motor 15. A linear cam or eccentric cam 17 is fastened to the cam shaft 16.

The horn holder 13 is urged by a spring 19 so that a cam follower 18 that is a roller rotatable on the horn holder 13 is pressed against the cam 17.

A detection plate 20 is attached to the undersurface of the horn holder 13. The detection plate 20 is on the opposite side of the supporting shaft 12 from the capillary and projects beyond the side surface of the horn holder 13. On the other hand, a linear sensor 21 is attached to the bonding head 11 so as to face the upper surface of the detection plate 20.

The reference numeral 22 is a linear motor which is used to set the bonding load. The magnet side 23 of the linear motor 22 is fastened to the bonding head 11, and the coil side 24 of the linear motor 22 is fastened to the horn holder 13.

The wire bonding method illustrated in FIGS. 4(a) through 4(g) is executed in the following manner:

First, as shown in FIG. 4(a), a ball 3a is formed by a spark discharge (created by an electric torch 5) on the wire 3 extending from the lower-end of the capillary 4. Then, the electric torch 5 moves in the direction indicated by the arrow.

Next, the XY table 10 (in FIG. 5) is driven so that the capillary 4 moves to a position above the first bonding point 1a as shown in FIG. 4(b). Then, the cam 17 is rotated in the forward direction as indicated by arrow A (in FIG. 5) so that the dropping profile of the cam 17 causes the horn holder 13 to pivot about the supporting shaft 12 as indicted by arrow B. As a result, as shown in FIG. 4(c), the capillary 4 is lowered, and the ball 3a of the wire 3 is connected to the first bonding point 1a.

Afterward, the cam 17 is rotated in the reverse direction so that the rising profile of the cam 17 causes the capillary 4 to be raised as shown in FIG. 4(d).

Next, the XY table 10 is driven so that the capillary 4 moves to a position above the second bonding point 2a as shown in FIG. 4(e). Then, the cam 17 is caused to rotate in the forward direction so that the capillary 4 is lowered and the wire 3 is connected to the second bonding point 2a. This is shown in FIG. 4(f).

Then, the cam 17 is rotated in the reverse direction, and the capillary 4 is raised to a predetermined position. Then, the clamper 6 is closed, and the capillary 4 and clamper 6 are raised together so that the wire 3 is cut as shown in FIG. 4(g).

One wire connection is thus completed.

Conventionally, the control of the Z-axis motor which drives the capillary 4 up and down is accomplished by a Z-axis control circuit such as that shown in FIG. 3.

In this diagram, a pulse input a (which is an operating command) is integrated by an integrator 30 to form an operating command pulse signal b; and a feedback speed signal c, a feedback compulsive pulse signal d, and a feedback pulse-by-pulse signal e are synthesized with the pulse signal b, thus obtaining a synthesized signal f.

The synthesized signal f is inputted into an amplifier 31, and motor gain control is accomplished with a fixed gain 32, and then the Z-axis motor 15 is operated via a motor driver 33.

In the above, the feedback speed signal c is obtained as follows: the output signal of an encoder 34 installed on the Z-axis motor 15 is waveform-shaped by a waveform shaping circuit 35 to produce a waveform-shaped signal g (Sin or Cos wave), which is then converted into a pulse signal h (actual operating pulse signal) by a pulse converter 36, and this pulse signal h is integrated by an integrator 37 so as to become the feedback speed signal c. This signal c performs speed feedback.

On the other hand, the feedback cumulative pulse signal d is a signal which feeds back the result (cumulative pulse) obtained in a comparison of the operating command pulse input a with the actual operating pulse signal h. The comparison is performed by a comparator 38.

Lastly, the feedback pulse-by-pulse signal e performs feedback within a single pulse. This signal is obtained as follows: the waveform-shaped signal g (Sin or Cos wave) which has been waveform-shaped by the waveform shaping circuit 35 is further converted by an F/V circuit (not shown) to form a sawtooth wave signal i, which is further differentiated by a differentiation circuit 39.

In the wire bonding operation shown in FIGS. 4(a) through 4(g), the capillary lowering operations in FIGS. 4(b) and 4(c) and FIGS. 4(e) and 4(f) are performed as shown in FIGS. 2(a) and 2(b) in order to increase the productivity. FIG. 2(a) shows the rotational speed of the Z-axis motor 15, and FIG. 2(b) shows the lowering path of the capillary 4.

More specifically, the Z-axis motor 15 is first caused to rotate in high-speed at 50, so that the capillary 4 is lowered rapidly at 55. Afterward, the rotational speed of the Z-axis motor 15 is reduced at 51, thus the lowering speed of the capillary 4 is reduced. Next, the Z-axis motor 15 is caused to rotate in a constant low-speed operation at 52, so that the capillary 4 is lowered at a low speed at 57 and then touches a workpiece at 53, thus letting the ball 3a or wire 3 contact the first bonding point 1a or the second bonding point 2a.

FIG. 2(c) shows the damper load 70 and the bonding load 71. The damper load 70 is for a stabilization of the capillary 4 during its raising and lowering actions, and the bonding load 71 is used during bonding. The damper load 70 and bonding load 71 are applied by the linear motor 22 that is shown in FIG. 5.

More specifically, until the Z-axis motor 15 enters the low-speed operation 52, a certain constant current is applied to the capillary 4. When the constant current is applied to the linear motor 22, the coil 24 of the motor 22 is repelled by the magnet 23 so that the horn holder 13 is pushed up, thus causing the cam follower 18 to be pressed against the cam 17. As a result, a large damper load 70 is applied to the capillary 4.

When the Z-axis motor 15 enters the low-speed operation 52, a current which is smaller than the above-described current is applied to the linear motor 22 so that a load (the bonding load 71) which is smaller than the damper load 70 is applied to the capillary 4. As a result, the ball 3a or the wire is bonded to the first bonding point 1a or the second bonding point 2a under a small bonding load 71.

FIG. 2(d) shows the ideal output waveform of the encoder 34 (see FIG. 3) in a case where the Z-axis motor 15 rotates smoothly according to the Z-axis command speed shown in FIG. 2(a).

As seen from above, the control of the capillary 4 during the wire bonding operation involves a speed change-over operation (high speed to low speed, and low speed to high speed) and a vertical movement change-over (raising to lowering, and lowering to raising). In the above prior art, the same feedback control is performed by the fixed gain circuit 32 shown in FIG. 3, regardless of which change-over operation is undergoing.

As to the change in the load on the Z-axis motor 15, the load applied to the cam 17 shown in FIG. 5 is released (i.e., the load is decreased) at the time of change-over from the large damper load 70 to the small bonding load 71 (as shown in FIG. 2(c). This occurs while the capillary 4 is being lowered, so that the cam 17 is in its dropping profile. Accordingly, during the application of the large damper load 70, the force which causes the cam 17 and Z-axis motor 15 to rotate in the direction of rotation of the cam 17 and Z-axis motor 15 is large.

However, when the load is switched from the large damper load 70 to the small bonding load 71, the force applied in the direction which causes the cam 17 and Z-axis motor 15 to rotate becomes weaker, and the rotation of the Z-axis motor 15 lags behind. As a result, immediately after such an change-over from the damper load 70 to the bonding load 71, a delayed output waveform 75 is outputted by the encoder 34 as shown in FIG. 2(e).

Accordingly, the feedback accomplished by the fixed gain circuit 32 acts to make the output waveform of FIG. 2(e) to be closer to the ideal operating state waveform which is shown in FIG. 2(d). However, feedback which works well during a high-speed operation is too strong for a low-speed operation. Accordingly, the load on the Z-axis motor 15 fluctuates, and in the case of a subsequent shift to low-speed operation, the actual operation lags behind the ideal operation shown in FIG. 2(d).

An attempt is made to catch up by causing the Z-axis motor 15 to rotate more rapidly. In this case, however, the rotational speed is increased by an excessive amount, and the operation advances too far. When the operation advances too far, feedback is applied which conversely slows down the rotation of the Z-axis motor. In this case, however, the rotational speed is excessively reduced, and the operation now lags behind again. Thus, as a result of the excessively strong application of feedback, an output waveform 76 is obtained which shows lags and advances instead of getting closer to the ideal operating state of FIG. 2(d). Accordingly, the rotational speed of the Z-axis motor 15 at the moment when the capillary comes into contact with the workpiece tends to vary with each ascending motion, so that there is a variation in the impact load at the time of the capillary's contact with the workpiece.

In the prior art described above, the same feedback is performed regardless of the operating state. Accordingly, when the load on the Z-axis motor 15 fluctuates, or when there is an abrupt change-over from high speed to low speed, etc., the Z-axis motor 15 does not rotate smoothly, and the resulting bonding stability is poor.

As a result, unnecessary vibration is generated, and the speed of the capillary at the time of contact with the semiconductor pellets or lead surfaces varies from bonding point to bonding point. Thus, there are differences in the impact load, which leads to a variation in the bonding strength and size of the pressure-bonded part of the wire and further to a variation in the shape of the wire loop.

In order to prevent this, it is necessary to take time to allow the Z-axis motor 15 to stabilize in the rotational speed, and then bring down the capillary after the stabilization of the rotation. In such cases, however, the operation speed of the apparatus is greatly slowed down.

SUMMARY OF THE INVENTION

Accordingly, the object of the present invention is to provide a motor control circuit for a wire bonding apparatus which makes it possible to achieve the operational control smooth and stable even when there are changes in the operating conditions and which thus makes it possible to accomplish the wire bonding of stable quality.

The object of the present invention is accomplished for a wire bonding apparatus in which a capillary is raised and lowered by a Z-axis motor and the capillary is moved in the X and Y directions by an X-axis motor and a Y-axis motor that drive an XY table, and the features of the invention is that a feedback gain circuit is utilized so as to perform a feedback control of the pulse signals that drives the Z-axis motor or at least one of the other two motors (X-axis motor or Y-axis motor) and a computer controls the gain value of this feedback gain circuit.

Accordingly, during high-speed operation, the gain value of the feedback gain circuit is increased by the computer, and during low-speed operation, the gain value of the feedback gain circuit is decreased by the computer. As a result, an excessive application of feedback during low-speed operation is prevented, and the motor can rotate in a smooth and stable manner.

In other words, since the motor operation can be controlled in a smooth and stable manner in accordance with various operating conditions, the speed of the capillary at the time of contact with semiconductor pellets or lead surfaces during the wire bonding operation can be stabilized, and also the operating stability can be secured in other operations as well. Accordingly, stable wire bonding is accomplished.

BRIEF DESCRIPTION OF THE DRAWINGS

FIGS. 4(a) through 4(g) illustrate the steps of one wire bonding method; and

DETAILED DESCRIPTION OF THE INVENTION

Figure 1:
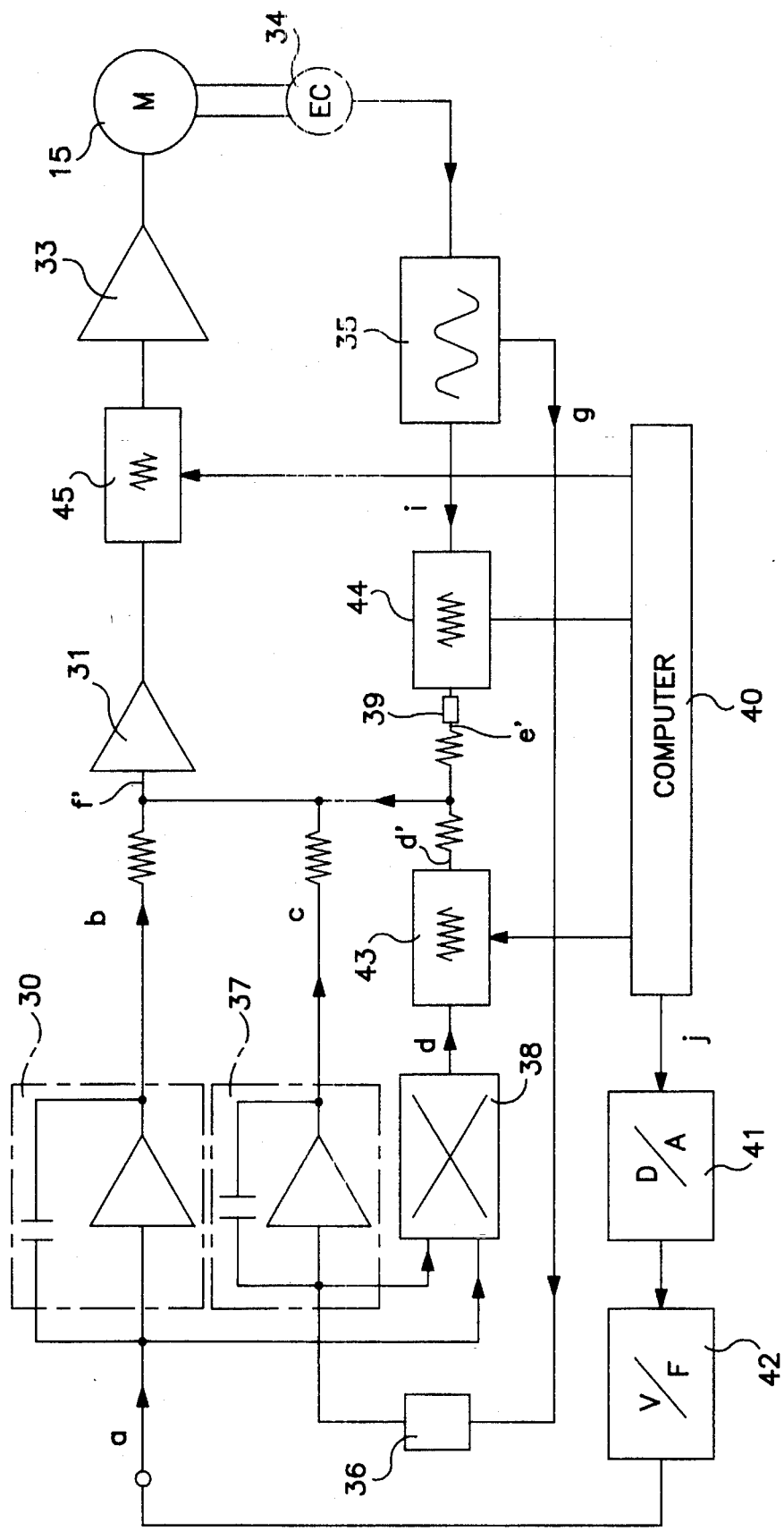
FIG. 1 is a block diagram illustrating one embodiment of the Z-axis motor circuit for a wire bonding apparatus according to the present invention.

In FIG. 1, the pulse input a is obtained in the following manner: the output signal j from a computer 40 is converted into a voltage by a D/A converter 41, and this voltage is frequency-converted by a V/F converter 42. The feedback cumulative pulse signal d is gain-controlled by a feedback gain circuit 43 and is outputted as a feed back cumulative pulse signal d'.

Furthermore, the sawtooth wave signal i is gain-controlled by a feedback gain circuit 44 and is then differentiated by a differentiation circuit 39 and outputted as a feedback pulse-by-pulse signal e'. The feedback speed signal c, feedback cumulative pulse signal d' and feedback pulse-by-pulse signal e' are synthesized with the operating command pulse signal b so as to become a synthesized signal f'. This synthesized signal f' is inputted into an amplifier 31 and is gain-controlled by a feedback gain circuit 45, thus operating the Z-axis motor 15 via a motor driver 33. Here, the feedback gain circuits 43, 44 and 45 are set by the computer 40 both at a strong feedback gain during high-speed operation (i.e., during high-speed rotation of the Z-axis motor 15), and at a weak feedback gain during low-speed operation.

Accordingly, during high-speed operation, a strong feedback gain is applied to the feedback cumulative pulse signal d by the feedback gain circuit 43 in the conversion of the signal d into the feedback cumulative pulse signal d'. Furthermore, in the case of the feedback pulse-by-pulse signal e', the voltage peaks of the sawtooth wave are increased to a large value by the feedback gain circuit 44. Moreover, the amplified synthesized signal f' controls the Z-axis motor 15 by means of a strong feedback gain supplied by the feedback gain circuit 45. Thus, during the high-speed operation, a strong feedback is applied so that the Z-axis motor 15 rotates in a smooth and stable manner.

Figure 2:
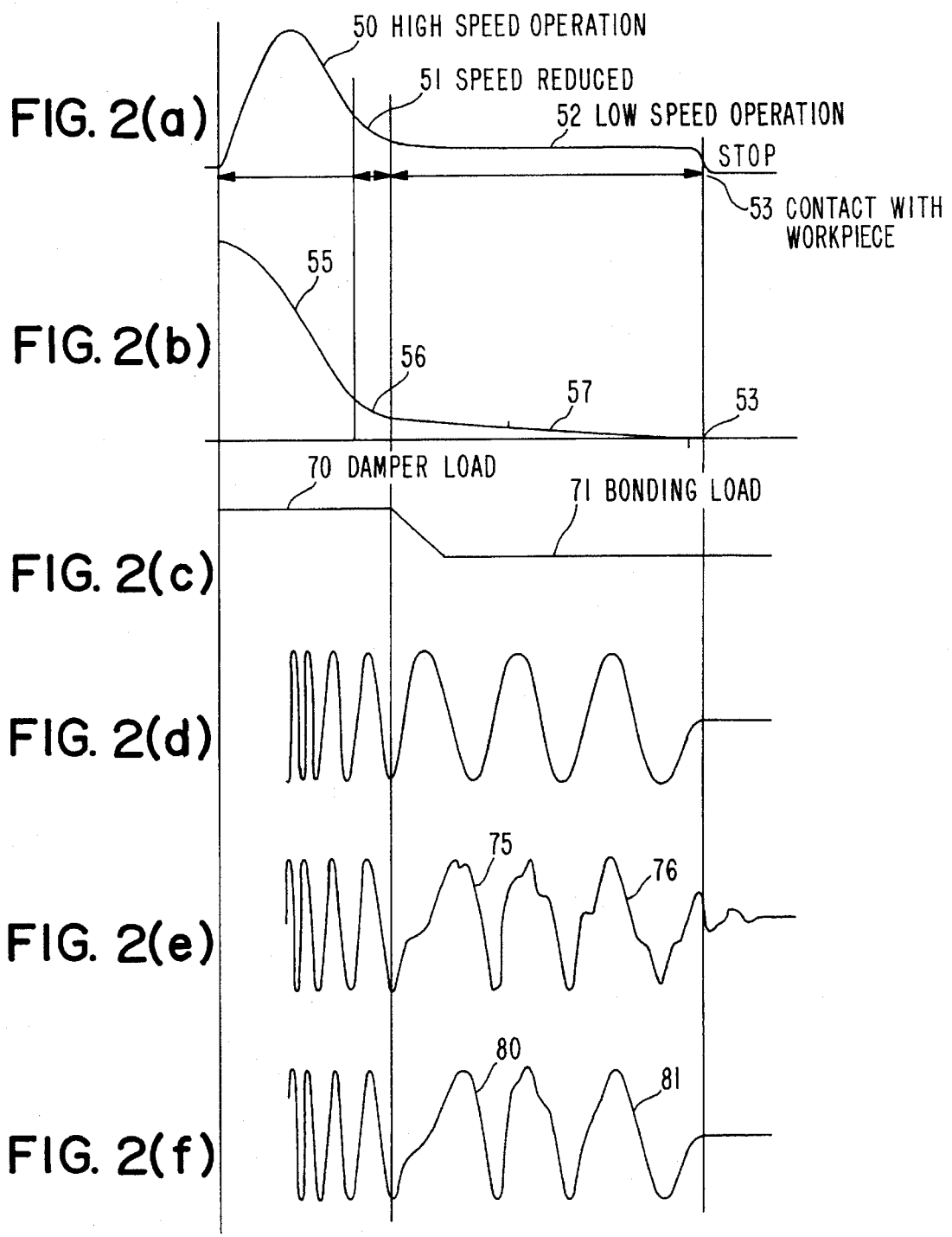
FIG. 2(a) is a graph showing the Z-axis speed command curve which causes rotation of the Z-axis motor.
FIG. 2(b) is a graph showing the Z-axis path of the capillary.
FIG. 2(c) shows the Z-axis load.
FIG. 2(d) is a graph showing the output waveform of the encoder in an ideal state.
FIG. 2(e) is a graph showing the output waveform of the encoder of prior art.
FIG. 2(f) is a graph showing the output waveform of the encoder according to the present invention.
Figure 3:
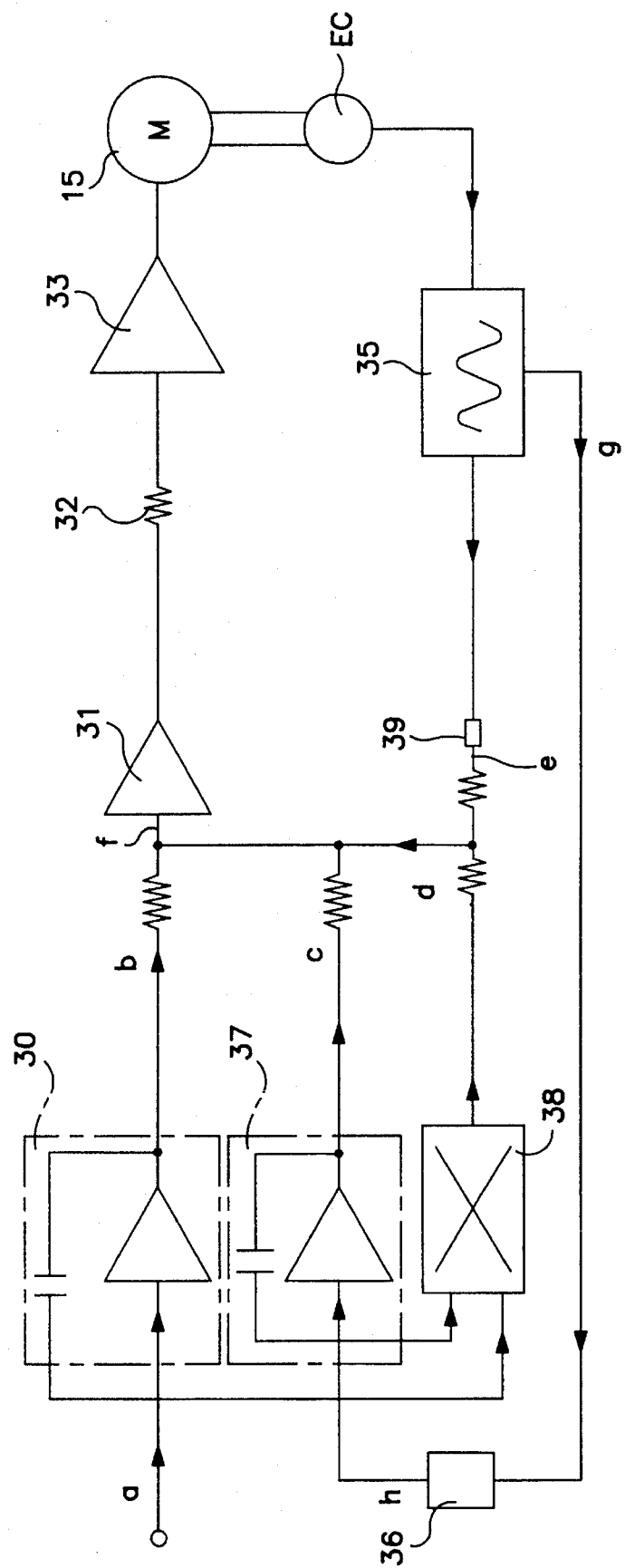
FIG. 3 is a block diagram of the Z-axis motor control circuit of prior art wire bonding apparatus.

In this embodiment as well, a delayed output waveform 80 is outputted by the encoder 34 as shown in FIG. 2(f) immediately after the load is switched from the large damper load 70 to the small bonding load 71 as shown in FIG. 2(c). After the load changes in this manner, the bonding apparatus shifts to low-speed operation. In the present embodiment, however, the feedback gain values of the feedback gain circuits 43, 44 and 45 are weakened by the computer 40. Accordingly, during the low-speed operation, feedback which is suited to such a low-speed operation is applied, and the rotation of the Z-axis motor 15 is caused to approach an ideal state smoothly and at a stable speed without any excessive rotation of the Z-axis motor 15. Thus, as shown in FIG. 2(f), the output waveform 81 of the encoder 34 stabilizes in a short period of time. Accordingly, the speed at the time of coming into contact with the semiconductor pellets or lead surfaces is stabilized, and wire bonding of stable quality is executed.

Furthermore, during low-speed operation, control is achieved by causing the computer 40 to output optimal gain values, in accordance with the rotational speed of the Z-axis motor 15, to the feedback gain circuits 43, 44 and 45. Moreover, during high-speed operation as well, operation according to the command speed curve of the Z-axis motor 15 shown in FIG. 2(a) can be achieved by altering the gain values during acceleration and deceleration. In the embodiment described above, the feedback gain circuits 43 and 44 are utilized; however, it would be possible to obtain results superior to those seen in conventional bonding apparatuses only with the use of the feedback gain circuit 45.

Figure 5:
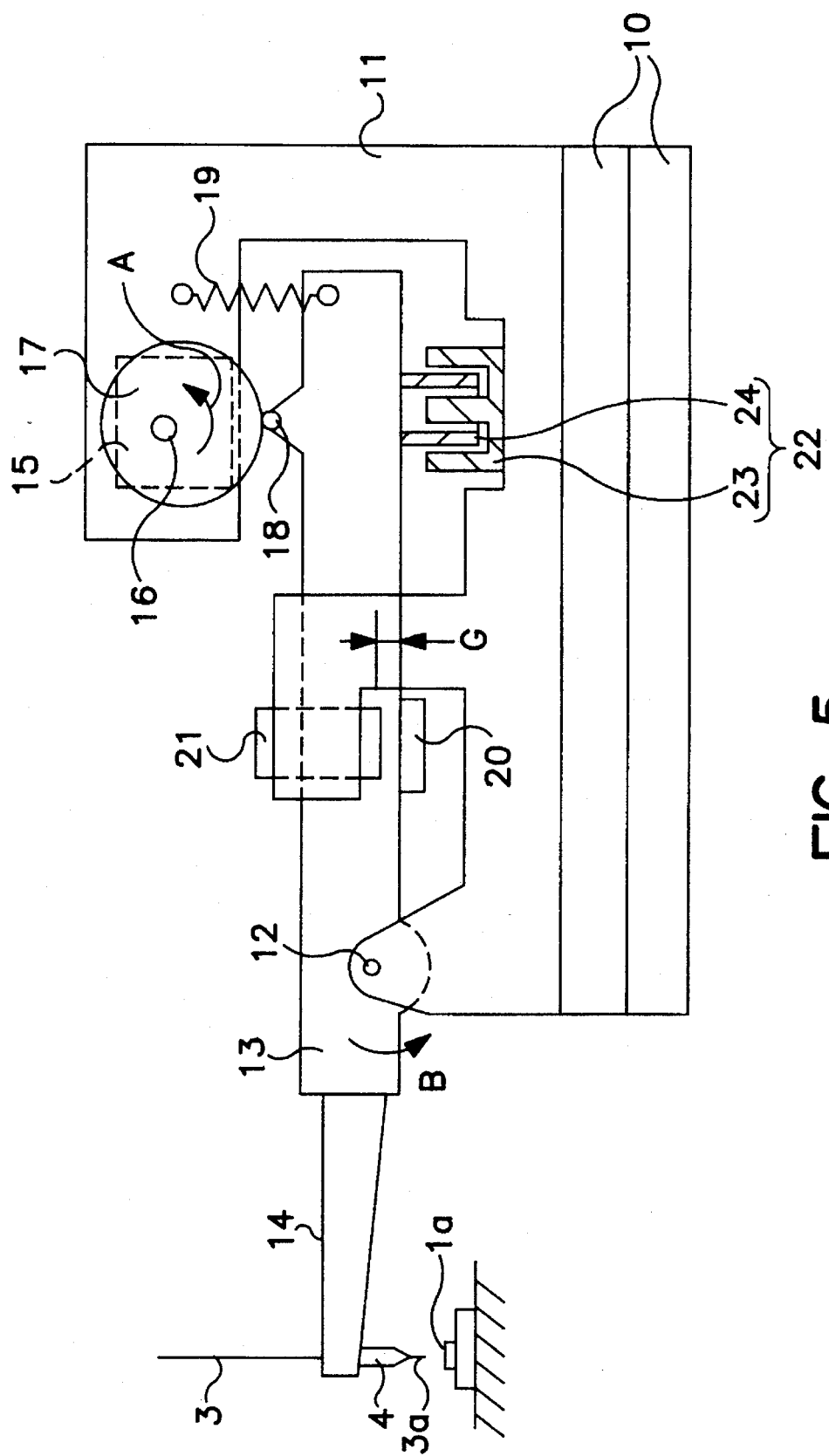
FIG. 5 is a side view of one example of a wire bonding apparatus.

The above embodiment is described with reference to the control of the Z-axis motor 15. However, the embodiment can be similarly applied to the control of the X-axis motor and Y-axis motor which drive the XY table 10 (see FIG. 5). Since the X-axis motor and Y-axis motor operate the XY table on which the Z-axis drive components are mounted, these motors require a larger force than the Z-axis motor. Accordingly, in order to operate the XY table, the motor gain must be set at a large value. However, if the same strong motor gain used during operation continues to be applied after the XY table 10 is stopped, the X-axis motor and Y-axis motor would vibrate, and there is a danger that the X-axis motor and Y-axis motor (or the motor drivers) will be damaged by the heat generated. Accordingly, during operation, a strong feedback gain is set in the feedback gain circuits 43, 44 and 45, and when the XY table is stopped, a weak feedback gain is set in the feedback gain circuit 45 alone.

When the XY table is abruptly switched from a high speed to a low speed, and is then operated at a constant speed, control similar to the above-described Z-axis motor control may be used. Furthermore, during high-speed operation, it is necessary to cause the actual operation to conform to the operating command (as in the case of Z-axis motor control); accordingly, a high motor gain is applied. Also when low-speed or single-pulse step operation of the XY table is executed, the pulse interval is long as in the case of Z-axis motor control; accordingly, the gain is lowered in order to prevent vibration and insures smooth operation in areas where no pulse is outputted.

According to the present invention, which is for a wire bonding apparatus in which a capillary is raised and lowered by a Z-axis motor and the capillary is moved in the X and Y directions by means of an X-axis motor and a Y-axis motor that drives an XY table, (1) a feedback gain circuit is installed which performs feedback control of the pulse signals that drive the Z-axis motor or at least one of the other two motors (X-axis motor or Y-axis motor), and (2) the gain value of the feedback gain circuit is controlled by a computer. Accordingly, even if the operating conditions change, the motor operation can be controlled in a smooth and stable manner, and the wire bonding of high quality is accomplished.

We claim:

1. A control circuit for controlling at least one of an X-axis, Y-axis and Z-axis motors of a wire bonding apparatus, said control circuit comprising:

a means for sensing a rotational speed of said motor and outputting a signal indicative of the sensed rotational speed;

a first variable gain feedback amplifier having its input coupled to said means for sensing and for amplifying said signal;

a comparator having first and second inputs with said signal coupled to one of said first and second inputs;

a second variable gain feedback amplifier coupled to the output of said comparator;

a first integrator coupled to said means for sensing and for integrating said signal;

a second integrator having an input and an output;

an amplifier to which the outputs of said first and second variable gain feedback amplifiers and said first and second integrators is applied;

a third variable gain feedback amplifier coupled to the output of said amplifier;

a motor driver means coupled to the output of said third variable gain feedback amplifier and for driving said motor; and a computer means coupled to said first, second and third variable gain feedback amplifiers and said input of said second integrator and an other of said first and second inputs of said comparator for issuing rotational speed change signals to said motor and for issuing gain control signals to said first, second and third variable gain feedback amplifier such that a gain of said first, second and third variable gain feedback amplifier is high when rotational speed of said motor is high and is low when said rotational speed of said motor is low.

\* \* \* \* \*